United States Patent
Mase et al.

(10) Patent No.: US 10,228,463 B2
(45) Date of Patent: Mar. 12, 2019

(54) DISTANCE-MEASUREMENT DEVICE AND METHOD FOR POWERING DISTANCE-MEASUREMENT DEVICE

(71) Applicant: HAMAMATSU PHOTONICS K.K., Hamamatsu-shi, Shizuoka (JP)

(72) Inventors: Mitsuhito Mase, Hamamatsu (JP); Jun Hiramitsu, Hamamatsu (JP); Akihiro Shimada, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 308 days.

(21) Appl. No.: 15/306,814

(22) PCT Filed: Apr. 7, 2015

(86) PCT No.: PCT/JP2015/060886
§ 371 (c)(1),
(2) Date: Oct. 26, 2016

(87) PCT Pub. No.: WO2015/170542
PCT Pub. Date: Nov. 12, 2015

(65) Prior Publication Data
US 2017/0045618 A1    Feb. 16, 2017

(30) Foreign Application Priority Data
May 8, 2014 (JP) .................. 2014-096698

(51) Int. Cl.
*G01S 17/10* (2006.01)
*G01C 3/06* (2006.01)
(Continued)

(52) U.S. Cl.
CPC ................ *G01S 17/10* (2013.01); *G01C 3/06* (2013.01); *G01S 7/484* (2013.01); *G01S 7/4863* (2013.01);
(Continued)

(58) Field of Classification Search
None
See application file for complete search history.

(56) References Cited

U.S. PATENT DOCUMENTS

| 2011/0037969 A1 | 2/2011 | Spickermann et al. |
| 2011/0317878 A1 | 12/2011 | Kang et al. |

(Continued)

FOREIGN PATENT DOCUMENTS

| JP | 2004-294420 A | 10/2004 |
| JP | 2007-526448 A | 9/2007 |

(Continued)

OTHER PUBLICATIONS

International Preliminary Report on Patentability dated Nov. 17, 2016 for PCT/JP2015/060886.

*Primary Examiner* — Hovhannes Baghdasaryan
(74) *Attorney, Agent, or Firm* — Drinker Biddle & Reath LLP

(57) ABSTRACT

In a ranging device, a controlling unit alternatively switches orders in time series of a first pulse-transfer-signal and a second pulse-transfer-signal per frame term and outputs the first and second pulse-transfer-signals. Furthermore, an arithmetic unit arithmetizes a distance to an object based on total quantities of charges of signal charges, in two frame term consecutive in the time series, accumulated in a first charge-accumulating region and a second charge-accumulating region in accordance with the first and second pulse-transfer-signals having an identical phase.

4 Claims, 8 Drawing Sheets

(51) Int. Cl.
  *H01L 27/146* (2006.01)
  *H01L 31/12* (2006.01)
  *H04N 5/335* (2011.01)
  *G01S 7/484* (2006.01)
  *G01S 7/486* (2006.01)
  *G01S 17/89* (2006.01)

(52) U.S. Cl.
  CPC ............ *G01S 7/4865* (2013.01); *G01S 17/89* (2013.01); *H01L 27/146* (2013.01); *H01L 31/12* (2013.01); *H04N 5/335* (2013.01)

(56) References Cited

U.S. PATENT DOCUMENTS

| | | | |
|---|---|---|---|
| 2012/0059625 | A1 | 3/2012 | Kim et al. |
| 2013/0128259 | A1* | 5/2013 | Mase ................ G01C 3/00 356/4.01 |

FOREIGN PATENT DOCUMENTS

| | | |
|---|---|---|
| JP | 2009-047662 A | 3/2009 |
| JP | 2011-164095 A | 8/2011 |
| JP | 2011-215073 A | 10/2011 |
| JP | 2012-083213 A | 4/2012 |
| JP | 2013-137242 A | 7/2013 |
| JP | 2013-206903 A | 10/2013 |
| WO | WO-2004/114369 A2 | 12/2004 |
| WO | WO-2007/026779 A1 | 3/2007 |

* cited by examiner

*Fig.5*
(a)
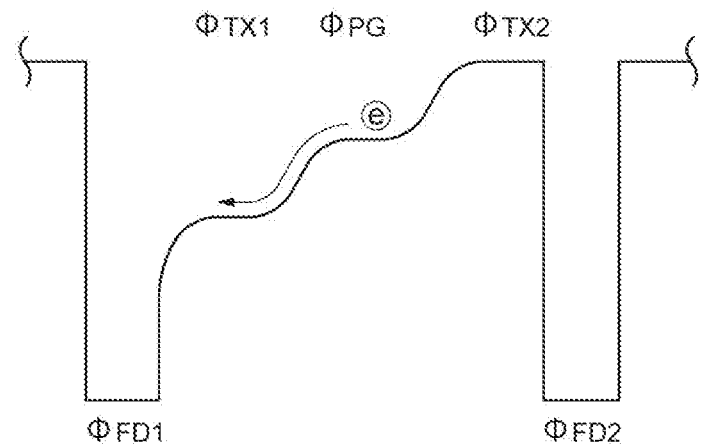
(b)
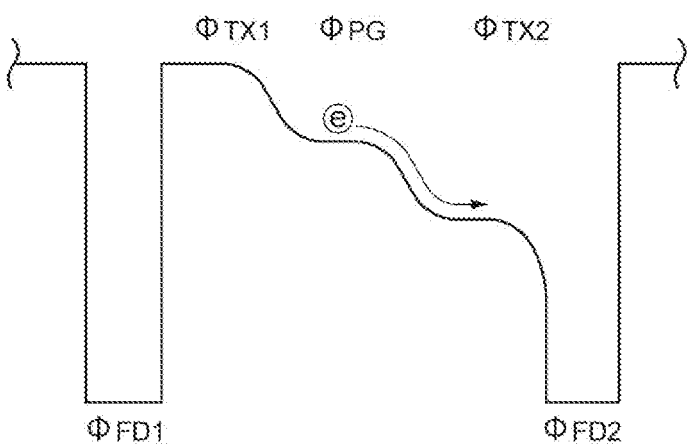

DISTANCE-MEASUREMENT DEVICE AND METHOD FOR POWERING DISTANCE-MEASUREMENT DEVICE

TECHNICAL FIELD

The present invention relates to a ranging device and a method for driving the ranging device.

BACKGROUND ART

Known ranging devices include a Time-Of-Flight (TOF) type range image sensor (for example, see Patent Literature 1). In the ranging device disclosed in Patent Literature 1, a plurality of range sensors is disposed in a one-dimensional direction. Each range sensor includes a rectangular charge-generating region, a pair of transfer-electrodes, and a pair of charge-accumulating regions. The pair of transfer-electrodes are respectively provided along a pair of sides opposing each other in the charge-generating region. The pair of charge-accumulating regions respectively accumulate signal charges transferred from the transfer-electrodes.

In this ranging device, each transfer-electrode distributes charges, as the signal charges, generated in the charge-generating region into each charge-accumulating region in accordance with transfer-signals having different phases. The distributed signal charges are accumulated in each corresponding charge-accumulating region.

The signal charges accumulated in each charge-accumulating region are read out as outputs corresponding to a quantity of the accumulated charges. Based on a rate of these outputs, a distance to an object is calculated.

CITATION LIST

Patent Literature

[Patent Literature 1] International Publication WO2007/026779

SUMMARY OF INVENTION

Technical Problem

The present inventors have investigated and discovered the followings. With regard to a ranging device such as the one described in the aforementioned Patent Literature 1, in two range sensors where distances to be measured should be equivalent, the distances to be measured may be different depending on the range sensors.

An object of the present invention is to provide a ranging device which reduces differences in the distances to be measured in the two range sensors where the distances to be measured should be equivalent and to provide a method for driving the ranging device.

Solution to Problem

The present inventors have investigated on a ranging device which reduces differences in distances to be measured in two range sensors where the distances to be measured should be equivalent and a method for driving the ranging device. As a result, the inventors have discovered the following facts.

In the ranging device disclosed in the Patent Literature 1, signals may be detected in range sensors other than a range sensor upon which light is incident (hereinafter described as an incident range sensor). The reason for this is considered to be an occurrence of crosstalk. Herein, charges generated in a charge-generating region of the incident range sensor flow in each charge-accumulating region of other range sensors. Effects of the crosstalk on each charge-accumulating region of other range sensors are different depending on a disposition of each charge-accumulating region. The effects of the crosstalk depend on whether the disposition of each charge-accumulating region of other range sensors is at an incident range sensor side. In other words, in other range sensors, the effects of the crosstalk are large on a charge-accumulating region disposed at the incident range sensor side. The effects of the crosstalk are small on a charge-accumulating region disposed at the opposite side of the incident range sensor side.

In a charge-distributing-type range sensor, a distance to an object is calculated based on a rate of outputs of each charge-accumulating region as mentioned above. Therefore, leakage of charges from ambient range sensors to each charge-accumulating region causes a change in the distance to be calculated by the range sensor. For example, even in a case where a quantity of charges to be distributed in accordance with transfer-signals of one phase and a quantity of charges to be distributed in accordance with the other phase are identical, the effects of the crosstalk are different in each of the charge-accumulating regions of two range sensors upon which the light is incident. Therefore, distances to be measured may be different between those two range sensors. In other words, even in a case where the distances to be measured should be equivalent in the two incident range sensors, when the dispositions of the charge-accumulating regions where the signal charges are accumulated in accordance with the transfer-signals having an identical phase are different from each other depending on whether they are at the other incident range sensor side, the distances to be measured may be different depending on the range sensors.

The present inventors have focused on these facts discovered by themselves and have further studied intensively on a configuration for reducing the differences in the distances to be measured in the two range sensors where the distances to be measured should be equivalent, thereby completing the present invention.

A ranging device according to an embodiment of the present invention includes a range image sensor, a driving unit, a controlling unit, and an arithmetic unit. The range image sensor includes a plurality of range sensors disposed in a one-dimensional direction. The range sensor includes, a charge-generating region, first and second charge-accumulating regions, a first transfer-electrode, and a second transfer-electrode. The driving unit drives a light source to emit pulse light with respect to an object per frame term. The charge-generating region is where charges are generated in accordance with incidence of reflected light of the pulse light reflected off the object. The first and second charge-accumulating regions are where the charges are accumulated, disposed away from the charge-generating region to sandwich the charge-generating region in the one-dimensional direction. The first transfer-electrode is disposed between the first charge-accumulating region and the charge-generating region. The second transfer-electrode is disposed between the second charge-accumulating region and the charge-generating region. The controlling unit outputs, per frame terms, in synchronism with emission of the pulse light, a first pulse-transfer-signal to the first transfer-electrode in such a matter that the charges generated in the charge-generating region flows as signal charges in the first charge-accumulating region, and a second pulse-transfersignal having a phase different from that of the first pulse-transfer-signal to the second transfer-electrode in such a matter that the charges generated in the charge-generating region flows as the signal charges in the second charge-accumulating region. The arithmetic unit reads out, per frame terms, each of quantities of the signal charges accumulated in the first and second charge-accumulating regions and arithmetizes a distance to the object based on the readout quantities of charges. The controlling unit alternatively switches orders in time series of the first pulse-transfer-signal and the second pulse-transfer-signal and outputs the first and second pulse-transfer-signals per frame terms. The arithmetic unit arithmetizes the distance to the object based on total quantities of the signal charges, in two frame terms consecutive in the time series, accumulated in the first charge-accumulating region and the second charge-accumulating region in accordance with first and second pulse-transfer-signals having an identical phase.

In a method for driving a ranging device according to an embodiment of the present invention, the ranging device includes a light source that emits pulse light with respect to an object and a range image sensor that includes a plurality of range sensors disposed in a one-dimensional direction. The range sensor includes a charge-generating region, first and second charge-accumulating regions, a first transfer-electrode, and a second transfer-electrode. The charge-generating region is where charges are generated in accordance with incidence of reflected light of the pulse light reflected off the object. The first and second charge-accumulating regions are where the charges are accumulated, disposed away from the charge-generating region to sandwich the charge-generating region in the one-dimensional direction. The first transfer-electrode is disposed between the first charge-accumulating region and the charge-generating region. The second transfer-electrode is disposed between the second charge-accumulating region and the charge-generating region. The method for driving the ranging device according to the embodiment includes: driving the light source so as to emit the pulse light per frame terms; outputting, per frame terms, in synchronism with emission of the pulse light, a first pulse-transfer-signal to the first transfer-electrode in such a matter that the charges generated in the charge-generating region flow as signal charges in the first charge-accumulating region and a second pulse-transfer-signal having a phase different from that of the first pulse-transfer-signal to the second transfer-electrode in such a matter that the charges generated in the charge-generating region flow as the signal charges in the second charge-accumulating region; reading out, per frame terms, each of quantities of the signal charges accumulated in the first and second charge-accumulating regions and arithmetizing a distance to the object based on the readout quantities of charges; when outputting the first and second pulse-transfer-signals, alternatively switching orders in time series of the first pulse-transfer-signal and the second pulse-transfer-signal and outputting the first and second pulse-transfer-signals per frame terms; and arithmetizing the distance to the object based on total quantities of the signal charges, in the two frame terms consecutive in the time series, accumulated in the first charge-accumulating region and the second charge-accumulating region in accordance with the first and second pulse-transfer-signals having an identical phase, when arithmetizing the distance to the object.

Herein, the pulse light is emitted from the light source per frame terms and the reflected light of the pulse light reflected off the object enters the range image sensor. In the range image sensor, the plurality of range sensors is disposed in the one-dimensional direction. Each range sensor includes the charge-generating region, and the first and second charge-accumulating regions disposed to sandwich the charge-generating region in the one-dimensional direction. In the range sensor upon which the reflected light is incident, charges are generated in the charge-generating region in accordance with the reflected light. The generated charges are accumulated as the signal charges in the first and second charge-accumulating regions per frame terms in accordance with the first and second pulse-transfer-signals. The first and second pulse-transfer-signals are different from each other in their phases. The orders in time series of the first and second pulse-transfer-signals are alternatively switched per frame terms and the both signals are output. Therefore, in one frame twin of the two frame terms consecutive in the time series, the signal charges are accumulated in the first charge-accumulating region and then in the second charge-accumulating region. Furthermore, in the other frame term, the signal charges are accumulated in the second charge-accumulating region and then in the first charge-accumulating region. The distance to the object is arithmetized based on the total quantities of the signal charges, in the two frame terms consecutive in the time series, accumulated in the first charge-accumulating region and the second charge-accumulating region in accordance with the first and second pulse-transfer-signals having the identical phase. These total quantities of charges are used for arithmetization of the distance to the object. Therefore, even in a case where the quantities of charges leaking from the other range sensor to the first and second charge-accumulating regions are different from each other, the effects of the leakage of charges are shared in well balance between the total quantity of charges corresponding to the pulse-transfer-signal in one phase and the total quantity of charges corresponding to the pulse-transfer-signal in the other phase. As a result, the effects of the crosstalk of the charges with respect to ranging will be similar between the range sensors adjacent in the one-dimensional direction. Accordingly, it is possible to reduce the differences in distances to be measured in the two range sensors where the distances to be measured which should be equivalent.

Advantageous Effects of Invention

According to an embodiment of the present invention, provided is a ranging device which reduces the difference in distances measured by two range sensors so as to be equivalent, and a method for driving the ranging device.

BRIEF DESCRIPTION OF DRAWINGS

FIG. 5 is a view showing potential profiles in the vicinity of a second principal surface of a semiconductor substrate.

DESCRIPTION OF EMBODIMENTS

Figure 1:
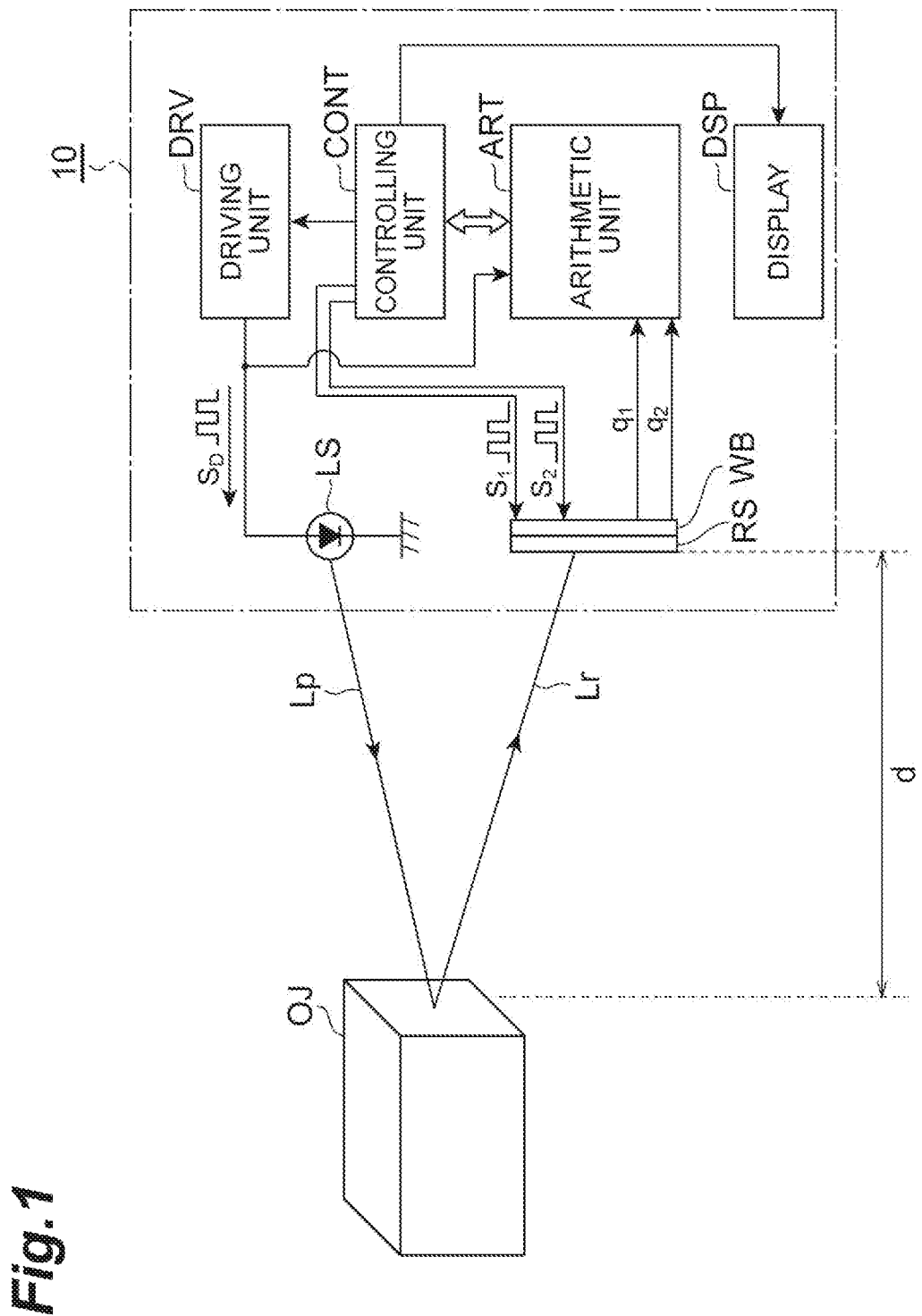
FIG. 1 is a configuration diagram of a ranging device according to an embodiment of the present invention.

An embodiment of the present invention will be hereinafter described in detail with reference to the accompanying drawings. Note that elements having common elements and performances will be denoted with the same reference numeral and redundant explanations will be omitted herein.

FIG. 1 is a configuration diagram of a ranging device according to the embodiment.

A ranging device 10 measures a distance d to an object OJ. The ranging device 10 includes a range image sensor RS, a light source LS, a display DSP, and a control unit. The control unit includes a driving unit DRV, a controlling unit CONT, and an arithmetic unit ART. The light source LS emits pulse light Lp with respect to the object OJ. The light source LS includes, for example, a laser irradiation device or LED. The range image sensor RS is a TOF-type range image sensor. The range image sensor RS is disposed upon a wiring board WB.

The control unit (the driving unit DRV, controlling unit CONT, and arithmetic unit ART) includes an arithmetic circuit such as a Central Processing Unit (CPU) and the like, a memory such as a Random Access Memory (RAM), a Read Only Memory (ROM), and the like, a power circuit, and hardware such as a readout circuit including an A/D converter. This control unit may partially or entirely include an integrated circuit such as an Application Specific Integrated Circuit (ASIC) or a Field Programmable Gate Array (FPGA).

The driving unit DRV applies a drive-signal $S_D$ to the light source LS in accordance with a control of the controlling unit CONT. Accordingly, the driving unit DRV drives the light source LS to emit the pulse light Lp with respect to the object OJ per frame term. The controlling unit CONT not only controls the driving unit DRV but also outputs first and second pulse-transfer-signals $S_1$ and $S_2$ to the range image sensor RS. The controlling unit CONT further controls the display DSP to display arithmetic results of the arithmetic unit ART. The arithmetic unit ART reads out quantities of charges $q_1$ and $q_2$ of signal charges from the range image sensor RS and arithmetizes the distance d based on the readout quantities of charges $q_1$ and $q_2$. The arithmetic unit ART outputs the arithmetic results to the controlling unit CONT. A detailed method for arithmetization of the distance d will be described later with reference to FIG. 7. The arithmetic results of the arithmetic unit ART are input from the controlling unit CONT to the display DSP. The display DSP displays the arithmetic results.

In the ranging device 10, due to the application of the drive-signal $S_D$ to the light source LS, the pulse light Lp is emitted from the light source LS per frame terms. When the pulse light Lp emitted from the light source LS enters the object OJ, reflected light Lr, which is pulse light, is emitted from the object OJ. The reflected light Lr emitted from the object OJ enters the charge-generating region of the range image sensor RS.

The quantities of charges $q_1$ and $q_2$ collected in synchronism with the first and second pulse-transfer-signals $S_1$ and $S_2$ are output pixel by pixel from the range image sensor RS. The output quantities of charges $q_1$ and $q_2$ are input to the arithmetic unit ART in synchronism with the drive-signal $S_D$. The arithmetic unit ART arithmetizes the distance d in each the pixel based on the input quantities of charges $q_1$ and $q_2$. The arithmetic results of the distance d are input to the controlling unit CONT. The arithmetic results input to the controlling unit CONT are transferred to and displayed on the display DSP.

Figure 2:
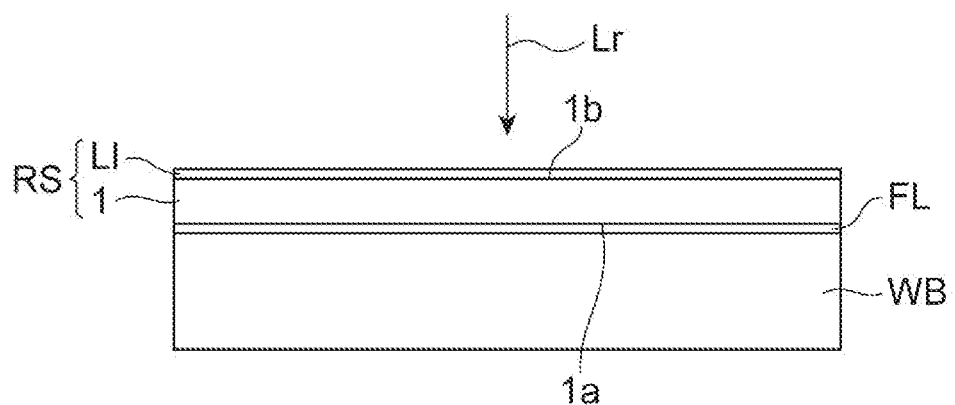
FIG. 2 is a cross-sectional view of a configuration of a range image sensor.

FIG. 2 is a cross-sectional view of a configuration of the range image sensor.

The range image sensor RS is a front-illuminated range image sensor and includes a semiconductor substrate 1 and a light interception layer LI. The semiconductor substrate 1 includes first and second principal surfaces 1a and 1b opposing each other. The second principal surface 1b is a light-incident surface. The range image sensor RS is bonded on the wiring board WB through an adhesive region FL in a state where the first principal surface 1a side of the semiconductor substrate 1 is opposing to the wiring board WB. The adhesive region FL includes an insulating adhesive and a filler. The reflected light Lr enters the range image sensor RS from the second principal surface 1b side of the semiconductor substrate 1. The light interception layer LI is provided upon the second principal surface 1b. The light interception layer LI includes a metal such as aluminum and the like.

Figure 3:
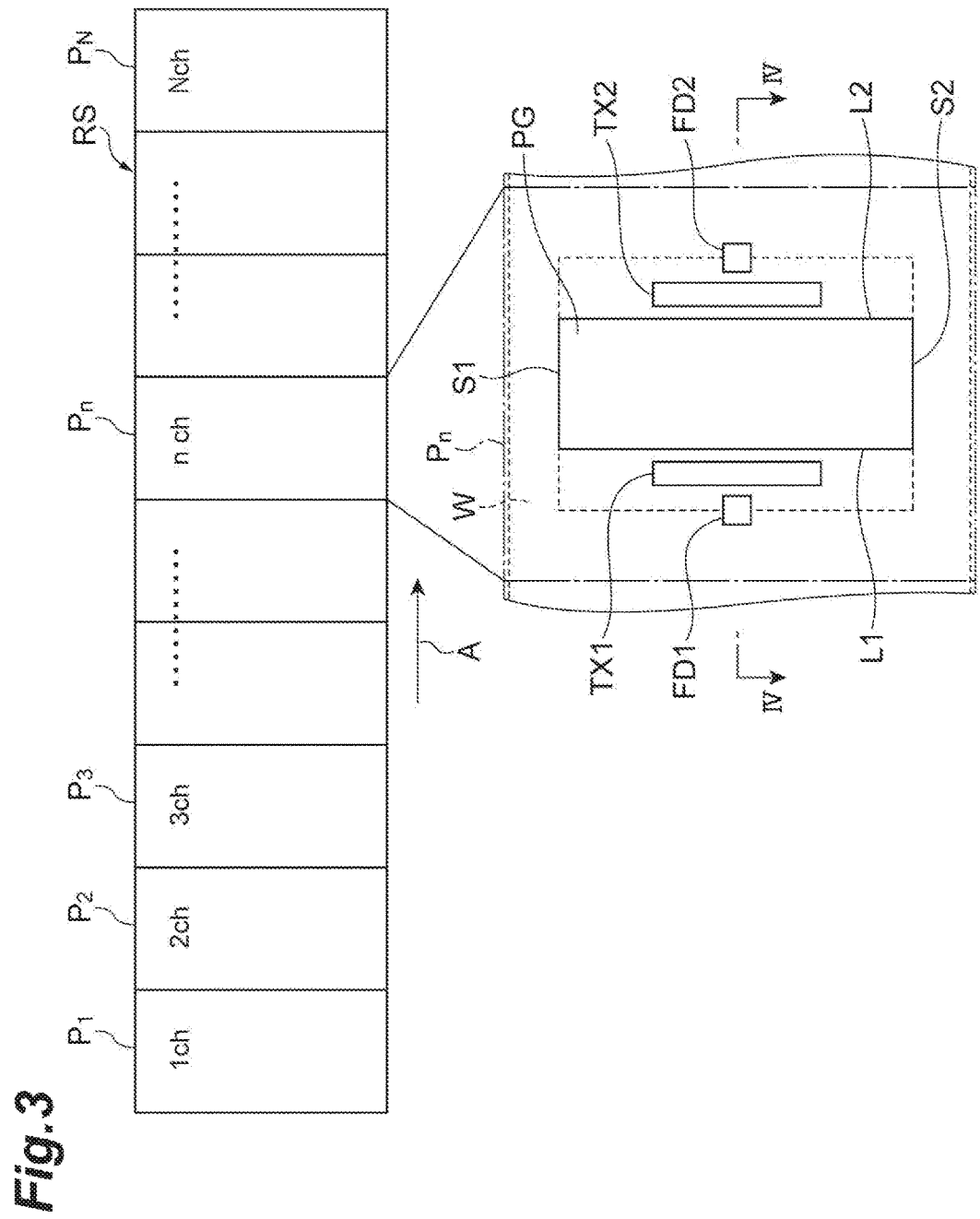
FIG. 3 shows a configuration of the range image sensor.
Figure 4:
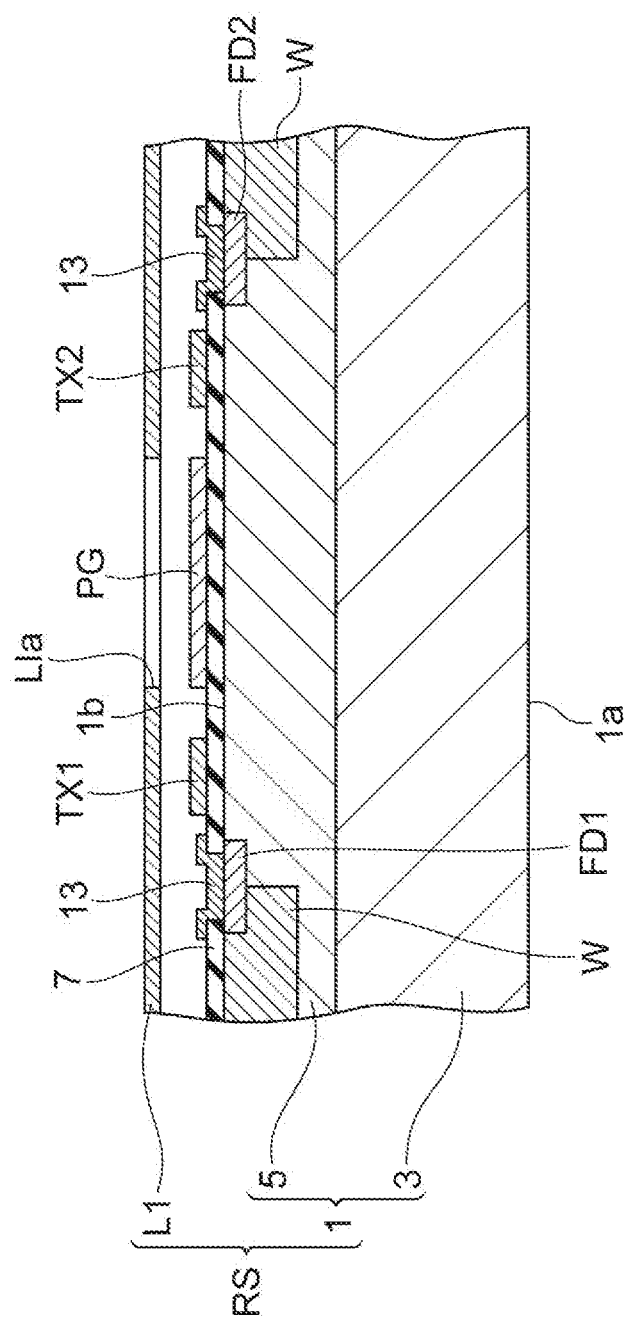
FIG. 4 is a cross-sectional view of the configuration taken along the line IV-IV in FIG. 3.

Successively, the range image sensor RS will be described in detail with reference to FIG. 3 and FIG. 4. FIG. 3 is a view showing a configuration of the range image sensor. FIG. 4 is a view showing a cross-sectional configuration taken along IV-IV line in FIG. 3.

The range image sensor RS is a line sensor with an array structure that includes a plurality of range sensors $P_1$ to $P_N$ (where N is a natural number of 2 more) disposed in a one-dimensional direction A. One pixel of the range image sensor RS includes at least one of the plurality of range sensors $P_1$ to $P_N$. Herein, one pixel of the range image sensor RS includes one of the plurality of range sensors $P_1$ to $P_N$. FIG. 3 solely shows a configuration of the range sensor $P_n$ (where n is a natural number of N or less). Each of the plurality of range sensors $P_1$ to $P_N$ has a configuration similar to the configuration of the range sensor $P_n$.

As mentioned above, the range image sensor RS includes the light interception layer LI. The light interception layer LI is provided to a front-side of the second principal surface 1b, which is the light-incident surface. In the light interception layer LI, an aperture LIa is formed in a region, corresponding to each of the plurality of range sensors $P_1$ to $P_N$, in the one-dimensional direction A. The aperture LIa is of a rectangular shape. Herein, the aperture LIa is shaped in a rectangle. The light enters the semiconductor substrate 1 as passing through the aperture LIa of the light interception layer LI. Accordingly, the aperture LIa defines a light-receiving region in the semiconductor substrate 1. Note that an illustration of the light interception layer LI is omitted in FIG. 3.

The semiconductor substrate 1 includes a p-type first semiconductor region 3 and a p⁻-type second semiconductor region 5. The p-type first semiconductor region 3 is disposed at the first principal surface 1a side. The p⁻-type second semiconductor region 5 has an impurity concentration lower than that of the first semiconductor region 3 and is disposed at the second principal surface 1b side. The semiconductor substrate 1 can be obtained, for example, by growing upon a p-type semiconductor substrate, a p⁻-type epitaxial layer with an impurity concentration lower than that of the semiconductor substrate. An insulating layer 7 is formed upon the second principal surface 1b (second semiconductor region 5) of the semiconductor substrate 1.

The plurality of range sensors $P_1$ to $P_N$ is disposed in the semiconductor substrate 1 in the one-dimensional direction A. In other words, the plurality of range sensors $P_1$ to $P_N$ is disposed in the semiconductor substrate 1 to form a line along the one-dimensional direction A. Each of the plurality of range sensors $P_1$ to $P_N$ includes a photogate electrode PG, first and second charge-accumulating regions FD1 and FD2, first and second transfer-electrodes TX1 and TX2, and a p-type well region W. Note that illustrations of the conductors 13 disposed upon the first and second charge-accumulating regions FD1 and FD2 (see FIG. 4) are omitted in FIG. 3.

The photogate electrode PG is disposed as corresponding to the aperture LIa. A region corresponding to the photogate electrode PG in the semiconductor substrate 1 (second semiconductor region 5) (a region located below the photogate electrode PG in FIG. 4) performs as a charge-generating region where charges are generated in accordance with incidence of the reflected light Lr of the pulse light Lp reflected off the object OJ. The photogate electrode PG corresponds to the shape of aperture LIa and is shaped like a parallelogram in a plane view. Herein, the photogate electrode PG is in a rectangular shape as similar to the aperture LIa. In other words, the photogate electrode PG includes first and second long sides L1, L2 and first and second short sides S1, S2. In the plane view, the first and second long sides L1, L2 are perpendicular to the one-dimensional direction A and are opposing to each other, while the first and second short sides S1, S2 are parallel to the one-dimensional direction A and are opposing to each other. The photogate electrode PG has the first long side L1 in one side of the one-dimensional direction A and the second long side L2 in the other side of the one-dimensional direction A.

The first and second charge-accumulating regions FD1, FD2 are disposed to sandwich the photogate electrode PG in the one-dimensional direction A. The first charge-accumulating region FD1 is disposed away from the photogate electrode PG on the first long side L1 of the photogate electrode PG. The second charge-accumulating region FD2 is disposed away from the photogate electrode PG on the second long side L2 of the photogate electrode PG Each of the plurality of range sensors $P_1$ to $P_N$ has the configuration similar to that of the range sensor $P_n$. Therefore, in two adjacent range sensors $P_n$ and $P_{n+1}$, the first charge-accumulating region FD1 and the second charge-accumulating region FD2 adjoin each other in the one-dimensional direction A.

The first and second charge-accumulating regions FD1 and FD2 are n-type semiconductor regions with high impurity concentrations. These regions are formed on the second semiconductor region 5 and accumulate the charges as the signal charges generated in the charge-generating region. Each of the first and second charge-accumulating regions FD1 and FD2 is shaped like a parallelogram in a plane view. Herein, each of the first and second charge-accumulating regions FD1 and FD2 is in a square shape in the plane view and has a shape similar to each other.

The first transfer-electrode TX1 is disposed upon the insulating layer 7 and between the first charge-accumulating region FD1 and the photogate electrode PG. The first transfer-electrode TX1 is disposed away from both the first charge-accumulating region FD1 and the photogate electrode PG. The first transfer-electrode TX1 allows the charges generated in the charge-generating region to flow as the signal charges into the first charge-accumulating region FD1 in accordance with the first pulse-transfer-signal $S_1$ (see FIG. 7).

The second transfer-electrode TX2 is disposed upon the insulating layer 7 and between the second charge-accumulating region FD2 and the photogate electrode PG The second transfer-electrode TX2 is disposed away from both the second charge-accumulating region FD2 and the photogate electrode PG The second transfer-electrode TX2 allows the charges generated in the charge-generating region to flow as the signal charges into the second charge-accumulating region FD2 in accordance with the second pulse-transfer-signal $S_2$ (see FIG. 7) different in phase from the first pulse-transfer-signal $S_1$. Each of the plurality of range sensors $P_1$ to $P_N$ has the configuration similar to that of the range sensor $P_n$. Therefore, in the two adjacent range sensors $P_n$ and $P_{n+1}$, the first transfer-electrode TX1 and second transfer-electrode TX2 adjoin each other in the one-dimensional direction A.

Each of the first and second transfer-electrodes TX1 and TX2 is shaped like a parallelogram in a plane view. Herein, each of the first and second transfer-electrodes TX1 and TX2 is in a rectangular shape having long sides perpendicular to the one-dimensional direction A, and each electrode is in a shape similar to each other. Lengths of the long sides of the first and second transfer-electrodes TX1, TX2 are shorter than lengths of the first and second long sides L1, L2 of the photogate electrode PG.

The well region W is formed on the second semiconductor region 5. When seen from a direction perpendicular to the second principal surface 1b, the well region W surrounds the photogate electrode PG, the first and second transfer-electrodes TX1, TX2, and the first and second charge-accumulating regions FD1, FD2. When seen from the direction perpendicular to the second principal surface 1b, the well region W partially overlaps the first and second charge-accumulating regions FD1 and FD2. A periphery of the well region W is substantially equivalent to a periphery of each of the plurality of range sensors $P_1$ to $P_N$. The well region W has a conductivity type identical to that of the second semiconductor region 5. The well region W has an impurity concentration higher than the impurity concentration of the second semiconductor region 5. The well region W restrains a depletion layer spreading with application of a voltage to the photogate electrode PG from being coupled to a depletion layer spreading from the first and second charge-accumulating regions FD1, FD2. Accordingly, a crosstalk is restrained.

The insulating layer 7 is provided with contact holes for exposing the surface of the second semiconductor region 5. Disposed in the contact holes are the conductors 13 for connecting the first and second charge-accumulating regions FD1, FD2 to the outside thereof.

Herein, a phrase "impurity concentration is high" represents that the impurity concentration is, for example, equal to or more than $1\times10^{17}$ cm$^{-3}$ and is indicated by "+" attached to the conductivity type. On the other hand, a phrase "impurity concentration is low" represents that the impurity concentration is, for example, equal to or less than $10\times10^{15}$ cm$^{-3}$ and is indicated by "−" attached to the conductivity type.

A thickness/impurity concentration of each semiconductor region is as follows.

First semiconductor region 3: thickness 10 to 1000 μm/impurity concentration $1\times10^{12}$ to $10^{19}$ cm$^{-3}$ Second semiconductor region 5: thickness 1 to 50 μm/impurity concentration $1\times10^{12}$ to $10^{15}$ cm$^{-3}$ First and second charge-accumulating regions FD1, FD2: thickness 0.1 to 1 μm/impurity concentration $1\times10^{18}$ to $10^{20}$ cm$^{-3}$ Well region W: thickness 0.5 to 5 μm/impurity concentration $1\times10^{16}$ to $10^{18}$ cm$^{-3}$ The semiconductor substrate 1 (first and second semiconductor regions 3, 5) is imparted with a reference potential such as a ground potential through a back gate or a through-via electrode or the like.

The semiconductor substrate includes Si, the insulating layer 7 includes $SiO_2$, and the photogate electrode PG and the first and second transfer-electrodes TX1, TX2 include poly-silicon, but it should be noted that other materials may be included in these units.

There is a 180-degree-shift between the phase of the first pulse-transfer-signal $S_1$ applied to the first transfer-electrode TX1 and the phase of the second pulse-transfer-signal $S_2$ applied to the second transfer-electrode TX2. The light incident upon each of the plurality of range sensors $P_1$ to $P_N$ is converted into charges in the semiconductor substrate 1 (second semiconductor region 5). A part of the charges generated in such a manner moves as the signal charges toward the first transfer-electrode TX1 or the second transfer-electrode TX2, namely, in a direction parallel to the first and second short sides S1, S2 of the photogate electrode PG in accordance with a potential gradient formed by voltages applied to the photogate electrode PG and the first and second transfer-electrodes TX1 and TX2.

When a positive potential is applied to the first transfer-electrode TX1 or the second transfer-electrode TX2, a potential below the first transfer-electrode TX1 or the second transfer-electrode TX2 becomes lower with respect to electrons than a potential of the semiconductor substrate 1 (second semiconductor region 5) below the photogate electrode PG Accordingly, the negative charges (electrons) are drawn toward the first transfer-electrode TX1 or the second transfer-electrode TX2 and are accumulated in potential wells formed by the first and second charge-accumulating regions FD1, FD2. Each of the n-type semiconductors contains a positively-ionized donor and has the positive potential to attract the electrons. When a potential lower than the positive potential (for example, the ground potential) is applied to the first transfer-electrode TX1 or the second transfer-electrode TX2, a potential barrier is caused by the first transfer-electrode TX1 or the second transfer-electrode TX2. Therefore, the charges generated in the semiconductor substrate 1 are not drawn into the first and second charge-accumulating regions FD1 and FD2.

FIG. 5 is view showing potential profiles in the vicinity of the second principal surface of a semiconductor substrate taken along the line IV-IV in FIG. 3. In FIG. 5, downward direction represents positive directions of potentials. FIG. 5 shows a potential $\varphi_{TX1}$ of a region just below the first transfer-electrode TX1, a potential $\varphi_{TX2}$ of a region just below the second transfer-electrode TX2, a potential $\varphi_{PG}$ of the charge-generating region just below the photogate electrode PG a potential $\varphi_{FD1}$ of the first charge-accumulating region FD1, and a potential $\varphi_{FD2}$ of the second charge-accumulating region FD2.

When the potentials ($\varphi_{TX1}$, $\varphi_{TX2}$) of the regions just below the adjacent first and second transfer-electrodes TX1, TX2 with no bias is defined as reference potentials, the potential $\varphi_{PG}$ of the region (charge-generating region) just below the photogate electrode PG is set to be higher than the reference potentials. This potential $\varphi_{PG}$ of the charge-generating region becomes higher than the potentials $\varphi_{TX1}$ and $\varphi_{TX2}$, and the potential profile will be in a shape recessed downward of the each drawing in the charge-generating region.

An accumulating operation of the signal charges will be described with reference to FIG. 5. When the phase of the first pulse-transfer-signal $S_1$ applied to the first transfer-electrode TX1 is zero degree, the positive potential is imparted to the first transfer-electrode TX1. To the second transfer-electrode TX2, imparted is a potential in the opposite phase, namely, a potential in a phase of 180 degrees (for example, the ground potential). To the photogate electrode PG, imparted is a potential between the potential imparted to the first transfer-electrode TX1 and the potential imparted to the second transfer-electrode TX2. In this case, as shown in FIG. 5(a), the potential $\varphi_{TX1}$ of the semiconductor just below the first transfer-electrode TX1 becomes lower than the potential $\varphi_{PG}$ of the charge-generating region. Accordingly, the negative charges e generated in the charge-generating region flow into the potential well of the first charge-accumulating region FD1.

On the other hand, the potential $\varphi_{TX2}$ of the semiconductor just below the second transfer-electrode TX2 is not lowered. Therefore, no charge flows into the potential well of the second charge-accumulating region FD2. Accordingly, the signal charges are collected and accumulated in the potential well of the first charge-accumulating region FD1. Since the first and second charge-accumulating regions FD1 and FD2 are doped with n-type impurities, the potentials thereof are recessed in the positive direction.

When the phase of the second pulse-transfer-signal $S_2$ applied to the second transfer-electrode TX2 is zero degree, the positive potential is imparted to the second transfer-electrode TX2. To the first transfer-electrode TX1, imparted is the potential in the opposite phase, namely, the potential in the phase of 180 degrees (for example, the ground potential). To the photogate electrode PG, imparted is a potential between the potential imparted to the first transfer-electrode TX1 and the potential imparted to the second transfer-electrode TX2. In this case, as shown in FIG. 5(b), the potential $\varphi_{TX2}$ of the semiconductor just below the second transfer-electrode TX2 becomes lower than the potential $\varphi_{PG}$ of the charge-generating region. Accordingly, the negative charges e generated in the charge-generating region flow into the potential well of the second charge-accumulating region FD2.

On the other hand, the potential $\varphi_{TX1}$ of the semiconductor just below the first transfer-electrode TX1 is not lowered. Therefore, no charge flows into the potential well of the first charge-accumulating region FD1. Accordingly, the signal charges are collected and accumulated in the potential well of the second charge-accumulating region FD2.

In such manners, the signal charges are collected and accumulated in the potential wells of the first and second charge-accumulating regions FD1 and FD2. The signal charges accumulated in the potential wells of the first and second charge-accumulating regions FD1, FD2 are read out to the outside thereof.

Figure 6:
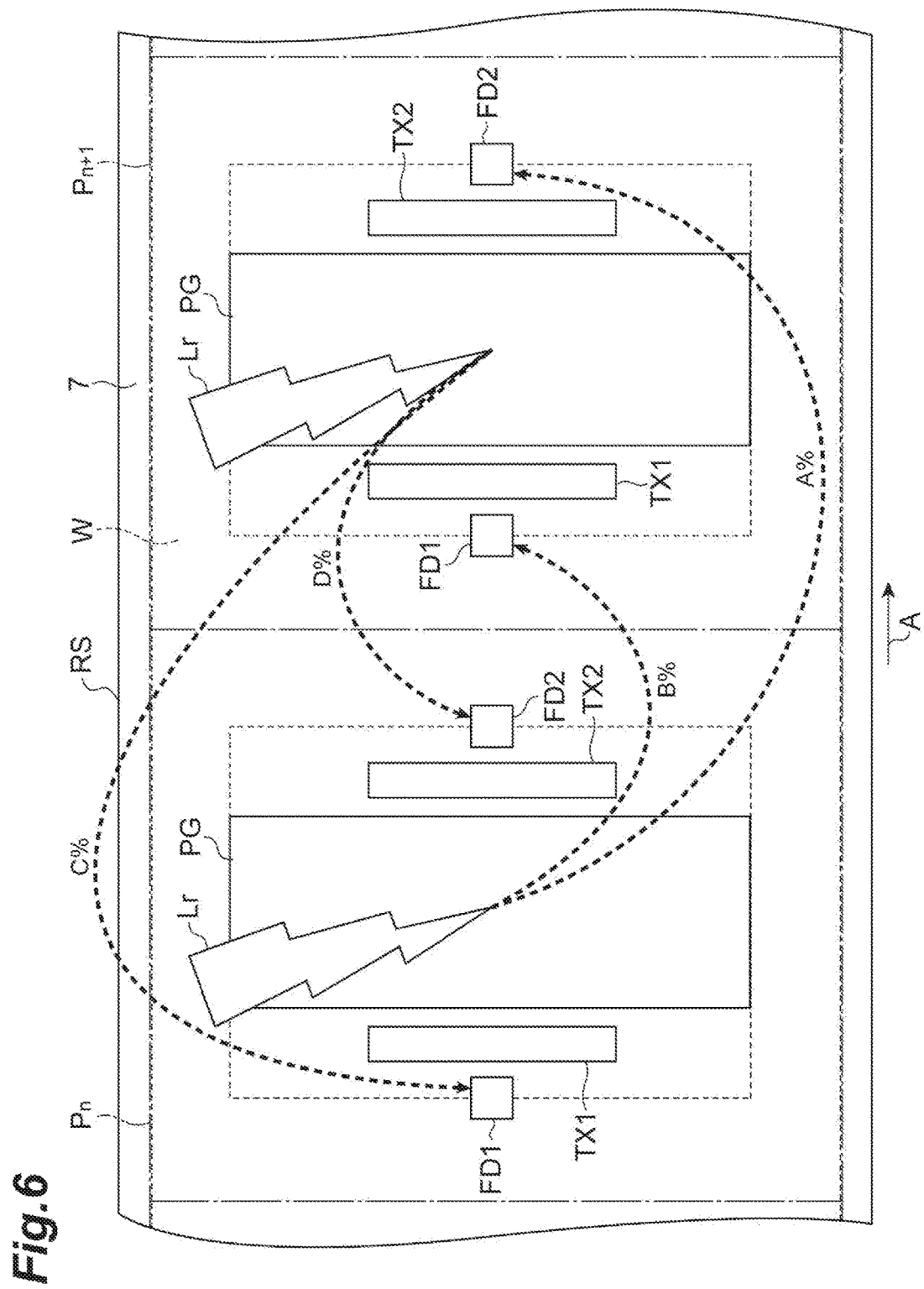
FIG. 6 is a view for explaining leakage of charges in the range sensor.

FIG. 6 is a view for explaining leakage of charges in the range sensor. Especially, the two adjacent range sensors $P_n$ and $P_{n+1}$ are shown in FIG. 6.

The range sensors $P_n$ and $P_{n+1}$ are similar in their configuration. Each includes the first charge-accumulating region FD1 and the first transfer-electrode TX1 in one side of the one-dimensional direction A of the photogate electrode PG and also includes the second charge-accumulating region FD2 and the second transfer-electrode TX2 in the other side. In the two adjacent range sensors $P_n$ and $P_{n+1}$, the first charge-accumulating region FD1 and the second charge-accumulating region FD2 adjoin each other in the one-dimensional direction A.

In the range image sensor RS, for example, when the reflected light Lr enters the range sensor $P_n$, charges are generated in the range sensor $P_n$ in accordance with the reflected light Lr. The generated charges are distributed into the first and second charge-accumulating regions FD1 and FD2 of the range sensor $P_n$ in accordance with the first and second pulse-transfer-signals $S_1$ and $S_2$. On this occasion, some charges leak into the first and second charge-accumulating regions FD1 and FD2 of other range sensors $P_m$ (m≠n). Amounts of leakage are significantly different depending upon whether dispositions of the first and second charge-accumulating regions FD1 and FD2 in the other range sensor $P_m$ are at the range sensor $P_n$ side thereof.

In the range sensor $P_{n+1}$, the first charge-accumulating region FD1 is disposed at the range sensor $P_n$ side thereof, while the second charge-accumulating region FD2 is disposed at the side opposite to the range sensor $P_n$. Therefore, when the light enters the range sensor $P_n$ and the charges leak from the range sensor $P_n$ to the range sensor $P_{n+1}$, an amount B % of leakage to the first charge-accumulating region FD1 is larger than an amount A % of leakage to the second charge-accumulating region FD2. Similarly, when the light enters the range sensor $P_{n+1}$ and the charges leak from the range sensor $P_{n+1}$ to the range sensor $P_n$, an amount D % of leakage to the second charge-accumulating region FD2 is larger than an amount C % of leakage to the first charge-accumulating region FD1, since the second charge-accumulating region FD2 in the range sensor $P_n$ is disposed at the range sensor $P_{n+1}$ side thereof.

As the charges leak each other between the two adjacent range sensors $P_n$ and $P_{n+1}$ in such manners, quantities of charges accumulated in each of the first and second charge-accumulating regions FD1 and FD2 may be different between the range sensor $P_n$ and the range sensor $P_{n+1}$.

Figure 7:
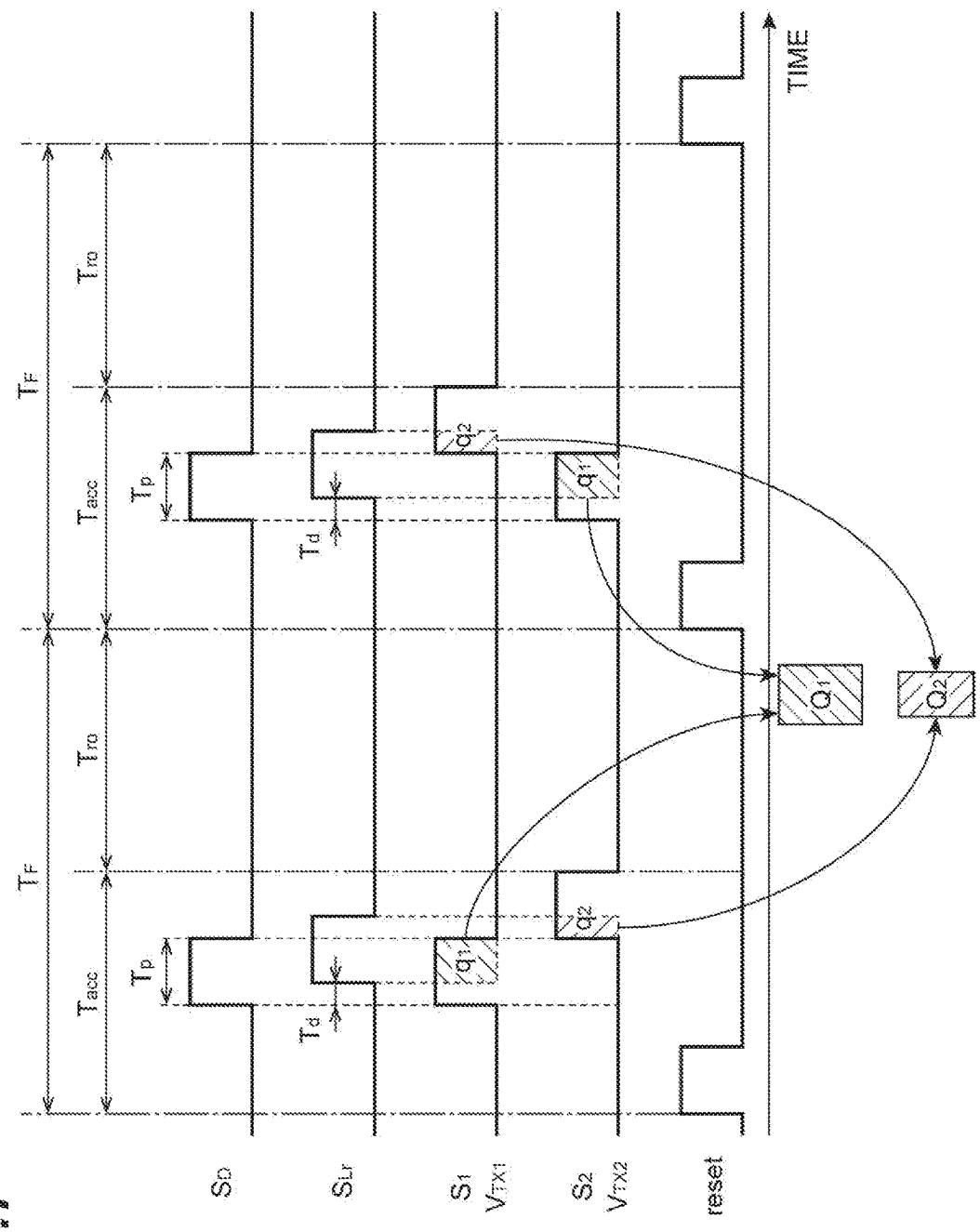
FIG. 7 is a timing chart of various signals.

Successively, a method for arithmetization of the distance d will be described with reference to FIG. 7. FIG. 7 is a timing chart of various signals. FIG. 7 shows two frame terms consecutive in time series $T_F$ among a plurality of frame terms $T_F$.

FIG. 7 shows the drive-signal $S_D$ of the light source LS, an intensity signal $S_L$, of the reflected light Lr when the reflected light Lr of the pulse light Lp reflected off the object OJ has returned to an imaging area, the first pulse-transfer-signal $S_1$ to be applied to the first transfer-electrode TX1, the second pulse-transfer-signal $S_2$ to be applied to the second transfer-electrode TX2, and a reset-signal reset. Each of the two frame terms $T_F$ includes a term in which the signal charges are accumulated (accumulating term) $T_{acc}$, and a term in which the signal charges are read out (readout tem) $T_{ro}$. The drive-signal $S_D$, the intensity signal $S_{Lr}$, the first pulse-transfer-signal $S_1$, and the second pulse-transfer-signal $S_2$ are pulse signals each having a pulse width $T_P$.

In the accumulating term $T_{acc}$, before ranging, the reset-signal reset is applied to the first and second charge-accumulating regions FD1 and FD2. Accordingly, the charges accumulated inside the first and second charge-accumulating regions FD1 and FD2 are discharged to the outside thereof. In this example, after the reset-signal reset is momentarily turned ON and then turned OFF, the drive-signal $S_D$ is applied to the light source LS. In synchronism with the application of the drive-signal $S_D$, the first and second pulse-transfer-signals $S_1$, $S_2$ are applied to the first and second transfer-electrodes TX1, TX2 having phases opposite to each other. Accordingly, the charges are transferred in such a matter that the signal charges are accumulated in the first and second charge-accumulating regions FD1 and FD2. Thereafter, in the readout term $T_{ro}$, the signal charges accumulated in the first and second charge-accumulating regions FD1 and FD2 are readout.

The orders in the time series of the first and second pulse-transfer-signals $S_1$ and $S_2$ are alternatively switched per frame terms $T_F$ and the first and second pulse-transfer-signals $S_1$ and $S_2$ are output. Therefore, in one frame term $T_F$ (herein, the fox mer frame term $T_F$ in the time series) of the two frame terms $T_F$ consecutive in the time series, the first pulse-transfer-signal $S_1$ is output in synchronism with the drive-signal $S_D$ by zero degree of a phase difference. At the same time, the second pulse-transfer-signal $S_2$ is output in synchronism with the drive-signal $S_D$ by 180 degrees of the phase difference. In the other frame term $T_F$ (herein, the latter frame tem. $T_F$ in the time series), the second pulse-transfer-signal $S_2$ is output in synchronism with the drive-signal $S_D$ by zero degree of the phase difference. At the same time, the first pulse-transfer-signal $S_1$ is output in synchronism with the drive-signal $S_D$ by 180 degrees of the phase difference.

Note that such output-controls of the first and second pulse-transfer-signals $S_1$ and $S_2$ are carried out by the controlling unit CONT. In other words, the controlling unit CONT outputs the first pulse-transfer-signal $S_1$ to the first transfer-electrode TX1 to synchronize with the emission of the pulse light Lp. Accordingly, the charges generated in the charge-generating region flow in the first charge-accumulating region FD1 as the signal charges per frame terms $T_F$. Furthermore, the controlling unit CONT outputs the second pulse-transfer-signal $S_2$, having the phase different from that of the first pulse-transfer-signal $S_1$, to the second transfer-electrode TX2 to synchronize with the emission of the pulse light Lp. Accordingly, the charges generated in the charge-generating region flow in the second charge-accumulating region FD2 as the signal charges per frame terms $T_F$. The controlling unit CONT further alternatively switches the orders in the time series of the first and second pulse-transfer-signals $S_1$ and $S_2$ and outputs the first and second pulse-transfer-signals $S_1$ and $S_2$ per frame terms $T_F$.

The quantity of charges $q_1$ corresponds to an overlap between the intensity signal $S_{Lr}$ and the signal output in synchronism with the drive-signal $S_D$ by zero degree of the phase difference. The quantity of charges $q_1$ is accumulated in the first charge-accumulating region FD1 in the one frame term $T_F$, and is accumulated in the second charge-accumulating region FD2 in the other frame term $T_F$. The quantity of charges $q_2$ corresponds to an overlap between the intensity signal $S_{Lr}$ of the reflected light Lr and the signal output in synchronism with the drive-signal $S_D$ by 180 degrees of the phase difference. The quantity of charges $q_2$ is accumulated in the second charge-accumulating region FD2 in the one frame term $T_F$, and is accumulated in the first charge-accumulating region FD1 in the other frame term $T_F$.

A phase difference Td between the intensity signal $S_{Lr}$ and the signal output in synchronism with drive-signal $S_D$ by zero degree of the phase difference is equal to time-of-flight of the light, which represents the distance d from the range image sensor RS to the object OJ. The distance d is arithmetized by the arithmetic unit ART using a rate of a total quantity of charges $Q_1$ of the quantity of charges $q_1$ and a total quantity of charges $Q_2$ of the quantity of charges $q_2$ in two frame terms $T_F$ consecutive in time series, and is represented by the following Formula (1). Note that c represents velocity of light.

$$\text{DISTANCE } d = (c/2) \times (T_P \times Q_2 / (Q_1 + Q_2)) \quad (1)$$

In other words, the arithmetic unit ART reads out each of the quantities of charges $q_1$ and $q_2$ of the signal charges accumulated in the first and second charge-accumulating regions FD1 and FD2 per frame terms $T_F$. The arithmetic unit ART then arithmetizes the distance d to the object OJ based on the readout quantities of charges $q_1$ and $q_2$. Herein, the arithmetic unit ART arithmetizes the distance d to the object OJ based on the total quantities of charges $Q_1$ and $Q_2$. The total quantities of charges $Q_1$ and $Q_2$ are total quantities of the signal charges accumulated in first charge-accumulating region FD1 and the second charge-accumulating region FD2, in accordance with the first and second pulsetransfer-signals $S_1$ and $S_2$ having the identical phase, in the two frame terms $T_F$ consecutive in the time series.

More specifically, the total quantity of charges $Q_1$ is a total of the following two quantities of charges. One is the quantity of charges $q_1$ of the signal charges accumulated in the first charge-accumulating region FD1 in the one frame term $T_F$ of the two frame terms $T_F$ consecutive in the time series, the other is the quantity of charges $q_1$ of the signal charges accumulated in the second charge-accumulating region FD2 in the other frame term $T_F$. Furthermore, the total quantity of charges $Q_2$ is a total of the following two quantities of charges. One is the quantity of charges $q_2$ of the signal charges accumulated in the second charge-accumulating region FD2 in the one frame term $T_F$, the other is the quantity of charges $q_2$ of the signal charges accumulated in the first charge-accumulating region FD1 in the other frame term $T_F$.

Accordingly, each of the total quantities of charges $Q_1$, $Q_2$ used for the arithmetization of the distance d is a sum of the quantities of charges $q_1$, $q_2$ of the signal charges accumulated in the first charge-accumulating region FD1 and the quantities of charges $q_1$, $q_2$ of the signal charges accumulated in the second charge-accumulating region FD2. Therefore, as mentioned above, even in a case where the quantities of charges accumulated in the first and second charge-accumulating regions FD1, FD2 are different between the range sensor $P_n$ and the range sensor $P_{n+1}$ due to leakage of the charges, effects of the leakage of the charges are shared by the total quantities of charges $Q_1$, $Q_2$ in well balance.

As a result, effects of the crosstalk of the charges with respect to the ranging will be similar between the range sensors $P_n$ and $P_{n+1}$ adjacent in the one-dimensional direction A. Therefore, in the range sensors $P_n$ and $P_{n+1}$, in a case where a ratio are equivalent between the quantity of charges distributed into the first charge-accumulating region FD1 by the first transfer-electrode TX1 and the quantity of charges distributed into second charge-accumulating region FD2 by the second transfer-electrode TX2, in other words, in a case where distances to be measured should be equivalent between the range sensor $P_n$ and the range sensor $P_{n+1}$, it is possible to reduce differences in the distances to be measured, which are ascribable to the leakage of the charges in the range sensors $P_n$ and $P_{n+1}$.

The arithmetization of the distance d is carried out based on the quantities of the signal charges accumulated in the first and second charge-accumulating regions FD1 and FD2 in the two frame terms $T_F$ consecutive in the time series. The arithmetization of the next distance d after the arithmetization of the distance d may be carried out based on the quantities of the signal charges accumulated in the first and second charge-accumulating regions FD1, FD2 in the two frame terms $T_F$ which are consecutive in the time series and to follow the two terms $T_F$ from which the quantities of the charges used for the arithmetization of the former distance d have been obtained. The arithmetization of the next distance d after the arithmetization of the distance d may be carried out based on the quantities of the signal charges accumulated in the first and second charge-accumulating regions FD1, FD2 in the latter frame term $T_F$ of the two frame terms $T_F$, where the quantities of charges used for the arithmetization of the former distance d have been obtained, and also in another frame term $T_F$ consecutive to the latter frame term $T_F$ in the time series.

Figure 8:
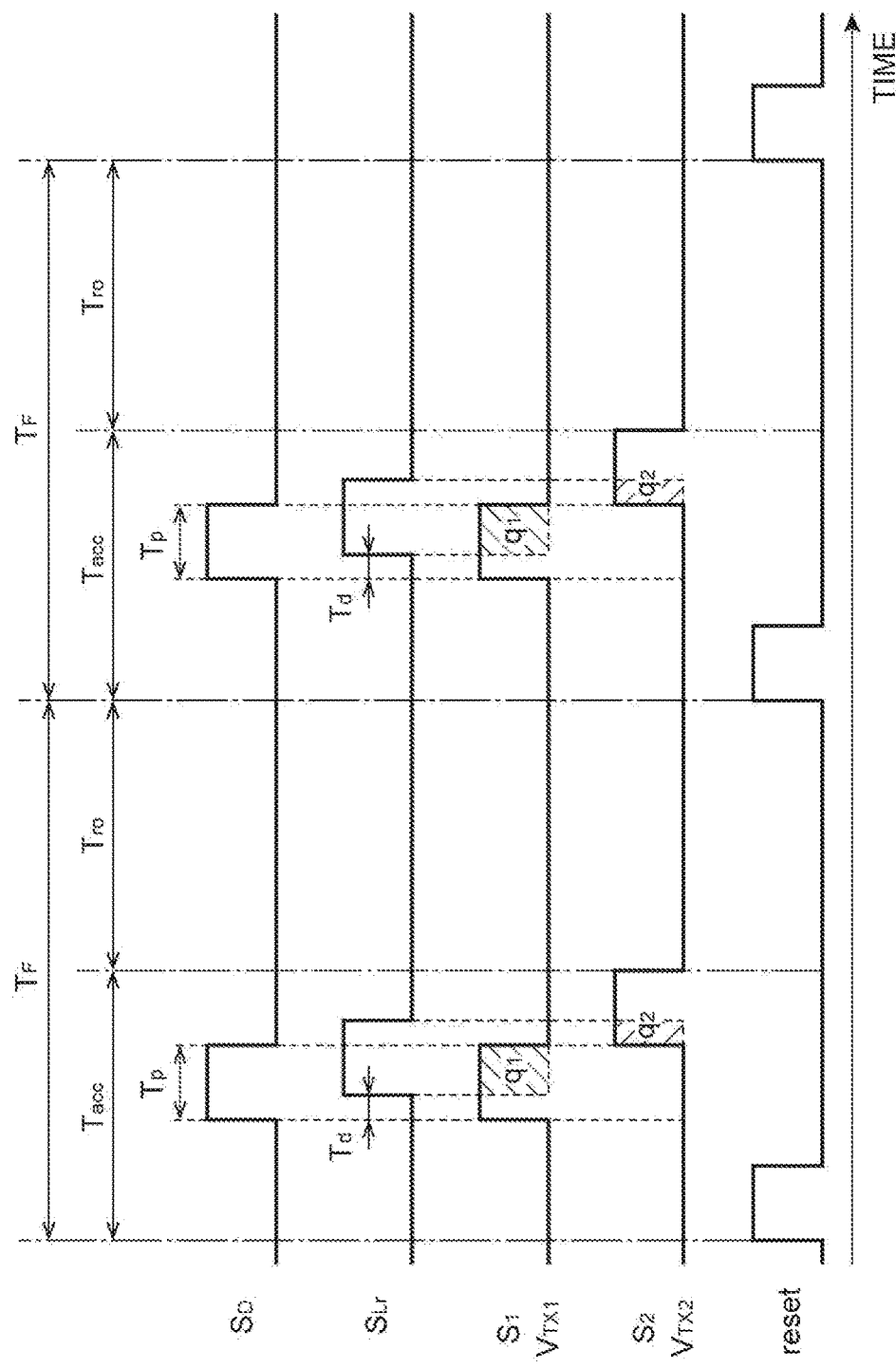
FIG. 8 is a timing chart of various signals in the known ranging device.

FIG. 8 is a timing chart of various signals in the known ranging device.

The known ranging device includes a configuration similar to that of the ranging device 10 according to the embodiment except for the following points. That is, a point where a controlling unit CONT outputs first and second pulse-transfer-signals $S_1$ and $S_2$ per frame term $T_F$ without alternatively switching orders in time series of the first and second pulse-transfer-signals $S_1$ and $S_2$; and a point where an arithmetic unit ART arithmetizes a distance d to an object OJ in one frame term $T_F$ based on a quantity of charges $q_1$ of signal charges accumulated in a first charge-accumulating region FD1 and a quantity of charges $q_2$ of signal charges accumulated in a second charge-accumulating region FD2. In other words, in the known ranging device, the distance d is arithmetized by following Formula (2), using a rate of the quantities of charges $q_1$ and $q_2$ in one frame term $T_F$.

$$\text{DISTANCE } d=(c/2)\times(T_P\times q_2/(q_1+q_2)) \qquad (2)$$

In the known ranging device, the quantity of charges $q_1$, corresponding to an overlap between the intensity signal $S_{Lr}$ and the signal output in synchronism with the drive-signal $S_D$ by zero degree of the phase difference, is a quantity of the signal charges accumulated solely in the first charge-accumulating region FD1. On the other hand, the quantity of charges $q_2$, corresponding to an overlap between the intensity signal $S_{Lr}$ of the reflected light Lr and the signal output in synchronism with the drive-signal $S_D$ by 180 degrees of the phase difference, is a quantity of the signal charges accumulated solely in the second charge-accumulating region FD2. Accordingly, as mentioned above, in a case where the quantities of the charges accumulated in the first and second charge-accumulating regions FD1 and FD2 are different between the range sensor $P_n$ and the range sensor $P_{n+1}$, the effects of the leakage of the charges will be imbalanced between the quantities of charges $q_1$ and $q_2$.

As a result, the ratio of the quantity of charges distributed into the first charge-accumulating region FD1 by the first transfer-electrode TX1 to the quantity of charges distributed into second charge-accumulating region FD2 by the second transfer-electrode TX2 is equivalent between the range sensor $P_n$ and the range sensor $P_{n+1}$. Therefore, even in a case where distances to be measured should be equivalent in the range sensor $P_n$ and the range sensor $P_{n+1}$, the distances to be measured may be different, which is ascribable to the leakage of the charges in the range sensors $P_n$ and $P_{n+1}$.

As mentioned above, in the ranging device 10 and the method for driving the ranging device 10 according to the embodiment, the pulse light Lp is emitted from the light source LS per frame terms $T_F$, and the reflected light Lr of the pulse light Lp reflected off the object OJ enters the range image sensor RS. In the range image sensor RS, the plurality of range sensors $P_1$ to $P_N$ is disposed in the one-dimensional direction A. Each range sensor includes the charge-generating region and the first and second charge-accumulating regions FD1, FD2 disposed to sandwich the charge-generating region in the one-dimensional direction A. In the range sensor $P_n$ upon which the reflected light Lr is incident, the charges are generated in the charge-generating region in accordance with the reflected light Lr. The generated charges are accumulated as the signal charges per frame terms $T_F$ in the first and second charge-accumulating regions FD1, FD2 in accordance with the first and second pulse-transfer-signals $S_1$, $S_2$. The first and second pulse-transfer-signals $S_1$, $S_2$ are different from each other in their phases. The orders in the time series of the first and second pulse-transfer-signals are alternatively switched per frame terms $T_F$ and the both signals are output. Therefore, in the one frame term $T_F$ of the two frame terms $T_F$ consecutive in the time series, after the signal charges are accumulated in the first charge-accumulating region FD1, the signal charges are accumulated in the second charge-accumulating region FD2. Furthermore, in the other frame term $T_F$, the signal charges are accumulated in the second charge-accumulating region FD2 and then accumulated in the first charge-accumulating region FD1. The distance d to the object OJ is arithmetized based on the total quantities of charges $Q_1$, $Q_2$ of the signal charges accumulated in the first charge-accumulating region FD1 and the second charge-accumulating region FD2, in accordance with first and second pulse-transfer-signals $S_1$, $S_2$ having the identical phase, in the two frame terms $T_F$ consecutive in the time series. These total quantities of charges $Q_1$ and $Q_2$ are used for the arithmetization of the distance d to the object OJ. Therefore, even in a case where the quantities of charges leaking from the other range sensor to the first and second charge-accumulating regions FD1, FD2 are different from each other, the effects of the leakage of the charges are shared in well balance between the total quantity of charges $Q_1$ corresponding to the pulse-transfer-signal in one phase and the total quantity of charges $Q_2$ corresponding to the pulse-transfer-signal in the other phase. As a result, effects of the crosstalk of the charges with respect to the ranging will be similar between the range sensors $P_n$ and $P_{n+1}$ adjacent in the one-dimensional direction A. Accordingly, it is possible to reduce the differences in the distances to be measured in the two range sensors $P_n$ and $P_{n+1}$ where the distances to be measured should be equivalent.

More specifically, the distance d to the object OJ is arithmetized based on the total quantity of charges $Q_1$ of the quantity of charges $q_1$ of the signal charges accumulated in the first charge-accumulating region FD1 in one frame term $T_F$ of the two frame terms $T_F$ consecutive in time series and of the quantity of charges $q_1$ of the signal charges accumulated in the second charge-accumulating region FD2 in the other frame term $T_F$. Furthermore, the distance d is arithmetized based on the total quantity of charges $Q_2$ of the quantity of charges $q_2$ of the signal charges accumulated in the second charge-accumulating region FD2 in the one frame term $T_F$ and the quantity of charges $q_2$ of the signal charges accumulated in the first charge-accumulating region FD1 in the other frame term $T_F$. Each of the total quantities of charges $Q_1$, $Q_2$ is a sum of the quantities of charges $q_1$, $q_2$ of the signal charges accumulated in the first charge-accumulating region FD1 and the quantities of charges $q_1$, $q_2$ of the signal charges accumulated in the second charge-accumulating region FD2. Accordingly, even in a case where the quantities of charges accumulated in the first and second charge-accumulating regions FD1, FD2 are different between the range sensor $P_n$ and the range sensor $P_{n+1}$ due to the leakage of the charges, the effects of the leakage of charges are shared by the total quantities of charges $Q_1$, $Q_2$ in well balance. As a result, in a case where the distances to be measured should be equivalent in the range sensor $P_n$ and the range sensor $P_{n+1}$, it is possible to reduce the differences in the distances to be measured, which are ascribable to the leakage of the charges in the range sensors $P_n$, $P_{n+1}$.

The present invention should not be restricted to the aforementioned embodiment. For example, in the aforementioned embodiment, in each of the plurality of range sensors $P_1$ to $P_N$, each number of the first and second transfer-electrodes TX1, TX2 and the first and second charge-accumulating regions FD1, FD2 is one, but may be two or more.

Each of the plurality of range sensors $P_1$ to $P_N$ may further include an unnecessary charge-collecting region and a third transfer-electrode. The unnecessary charge-collecting region is where the charges generated in the charge-generating region are collected as unnecessary charges. The third transfer-electrode is disposed between the unnecessary charge-collecting region and the charge-generating region and allows the charges generated in the charge-generating region to flow into the unnecessary charge-collecting region as the unnecessary charges in accordance with a third pulse-transfer-signal having a phase different from those of the first and second pulse-transfer-signals. In this case, the unnecessary charges can be discharged to the outside thereof in such a matter that measurement accuracy of the distance can be improved. Note that each number of the unnecessary charge-collecting region and the third transfer-electrode may be two or more.

In each frame term $T_F$, a plurality of drive-signals $S_D$ may be applied successively. In synchronism with this application, the first pulse-transfer-signal $S_1$ and the second pulse-transfer-signal $S_2$ may be output successively. In this case, the signal charges are added up and accumulated in the first and second charge-accumulating regions FD1, FD2.

The range image sensor RS is the line sensor that includes each of the plurality of range sensors $P_1$ to $P_N$ disposed one-dimensionally, but each of the plurality of range sensors $P_1$ to $P_N$ may be disposed two-dimensionally. In this case, a two-dimensional image is obtained readily. It should be noted that the two-dimensional image can also be obtained by rotating the line sensor or by scanning with two line sensors.

The range image sensor RS is not limited to the front-illuminated range image sensor. The range image sensor RS may be a back-illuminated range image sensor.

The charge-generating region where the charges are generated in accordance with the incident light may include a photodiode (for example, an embedded photodiode).

The conductivity types, that is, p-type and n-type, of the range image sensor RS according to the present embodiment may be replaced by each other to be opposite to those described above.

INDUSTRIAL APPLICABILITY

The present invention is applicable to a ranging device including a TOF-type range image sensor and a method for driving the ranging device.

REFERENCE SIGNS LIST

10 RANGING DEVICE
A ONE-DIMENSIONAL DIRECTION
FD1 FIRST CHARGE-ACCUMULATING REGION
FD2 SECOND CHARGE-ACCUMULATING REGION
$P_1$ to $P_N$ RANGE SENSOR
PG PHOTOGATE ELECTRODE
RS RANGE IMAGE SENSOR
$S_1$ FIRST PULSE-TRANSFER-SIGNAL
$S_2$ SECOND PULSE-TRANSFER-SIGNAL
TX1 FIRST TRANSFER-ELECTRODE
TX2 SECOND TRANSFER-ELECTRODE
LS LIGHT SOURCE
DRV DRIVING UNIT
ART ARITHMETIC UNIT
Of OBJECT
Lp PULSE LIGHT
Lr REFLECTED LIGHT
$T_F$ FRAME TERM
$q_1$, $q_2$ QUANTITY OF CHARGES
$Q_1$, $Q_2$ TOTAL QUANTITY OF CHARGES
D DISTANCE

The invention claimed is:

1. A ranging device comprising:
   a driving unit that drives a light source to emit pulse light with respect to an object per frame term;
   a range image sensor that includes a plurality of range sensors disposed in a one-dimensional direction, each of the plurality of range sensors including:
      a charge-generating region generating charges in accordance with incidence of reflected light of the pulse light reflected off the object,
      first and second charge-accumulating regions accumulating the charge and disposed away from the charge-generating region to sandwich the charge-generating region in the one-dimensional direction,
      a first transfer-electrode disposed between the first charge-accumulating region and the charge-generating region, and
      a second transfer-electrode disposed between the second charge-accumulating region and the charge-generating region;
   a controlling unit that outputs, per frame terms, in synchronism with emission of the pulse light, a first pulse-transfer-signal to the first transfer-electrode in such a matter that the charges generated in the charge-generating region flows as signal charges in the first charge-accumulating region and a second pulse-transfer-signal having a phase different from that of the first pulse-transfer-signal to the second transfer-electrode in such a matter that the charges generated in the charge-generating region flows as the signal charges in the second charge-accumulating region; and
   an arithmetic unit that reads out, per frame terms, each of quantities of the signal charges accumulated in the first and second charge-accumulating regions and that arithmetizes a distance to the object based on the readout quantities of charges, wherein
   the controlling unit alternatively switches orders in time series of the first pulse-transfer-signal and the second pulse-transfer-signal and outputs the first and second pulse-transfer-signals per frame terms, and
   the arithmetic unit arithmetizes the distance to the object based on total quantities of the signal charges, in two frame terms consecutive in the time series, accumulated in the first charge-accumulating region and the second charge-accumulating region in accordance with the first and second pulse-transfer-signals having an identical phase.

2. The ranging device according to claim 1, wherein the arithmetic unit arithmetizes the distance to the object based on a total of a quantity of the signal charges accumulated in the first charge-accumulating region in one frame term of the two frame terms consecutive in the time series and a quantity of the signal charges accumulated in the second charge-accumulating region in the other frame term, and based on a total of a quantity of the signal charges accumulated in the second charge-accumulating region in the one frame term and a quantity of the signal charges accumulated in the first charge-accumulating region in the other frame term.

3. A method for driving a ranging device including:
   a light source emitting pulse light with respect to an object; and
   a range image sensor that includes a plurality of range sensors disposed in a one-dimensional direction, each of the plurality of range sensors including:
      a charge-generating region generating charges in accordance with incidence of reflected light of the pulse light reflected off the object,
      first and second charge-accumulating regions accumulating the charge and disposed away from the charge-generating region to sandwich the charge-generating region in the one-dimensional direction,
      a first transfer-electrode disposed between the first charge-accumulating region and the charge-generating region, and
      a second transfer-electrode disposed between the second charge-accumulating region and the charge-generating region,
   the method comprising:
   driving the light source so as to emit the pulse light per frame term;
   outputting, per frame terms, in synchronism with emission of the pulse light, a first pulse-transfer-signal to the first transfer-electrode in such a matter that the charges generated in the charge-generating region flows as signal charges in the first charge-accumulating region and a second pulse-transfer-signal having a phase different from that of the first pulse-transfer-signal to the second transfer-electrode in such a matter that the charges generated in the charge-generating region flows as the signal charges in the second charge-accumulating region;
   reading out, per frame terms, each of quantities of the signal charges accumulated in the first and second charge-accumulating regions and arithmetizing a distance to the object based on the readout quantities of the charges;
   when outputting the first and second pulse-transfer-signals, alternatively switching orders in time series of the first pulse-transfer-signal and the second pulse-transfer-signal and outputting the first and second pulse-transfer-signals per frame term; and
   arithmetizing the distance to the object based on total quantities of the signal charges, in the two frame terms consecutive in the time series, accumulated in the first charge-accumulating region and the second charge-accumulating region in accordance with the first and second pulse-transfer-signals having an identical phase, when arithmetizing the distance to the object.

4. The method for driving the ranging device according to claim 3, wherein the distance to the object is arithmetized based on a total of a quantity of the signal charges accumulated in the first charge-accumulating region in one frame term of the two frame terms consecutive in the time series and a quantity of the signal charges accumulated in the second charge-accumulating region in the other frame term, and based on a total of a quantity of the signal charges accumulated in the second charge-accumulating region in the one frame term and a quantity of the signal charges accumulated in the first charge-accumulating region in the other frame term, when arithmetizing the distance to the object.

* * * * *